United States Patent [19]

Katoh et al.

[11] Patent Number: 4,770,901

[45] Date of Patent: Sep. 13, 1988

[54] PROCESS FOR FORMATION OF TIN OXIDE FILM

[75] Inventors: Yukihiro Katoh, Hyogo; Hideo Kawahara, Osaka; Masato Hyohdou, Hyogo; Hironobu Yamamoto, Kanagawa, all of Japan

[73] Assignee: Nippon Sheet Glass Co., Ltd., Osaka, Japan

[21] Appl. No.: 892,643

[22] Filed: Aug. 4, 1986

[30] Foreign Application Priority Data

Aug. 5, 1985 [JP] Japan .................................. 60-172125

[51] Int. Cl.[4] ........................... B05D 5/12; B05D 3/02
[52] U.S. Cl. .................................... 427/108; 427/110; 427/126.2; 427/126.3; 427/166; 427/168; 427/226; 427/299; 427/314; 427/419.2; 427/419.3; 427/427
[58] Field of Search ................ 427/168, 108, 314, 110, 427/299, 126.2, 419.2, 126.3, 419.3, 166, 226, 427·

[56] References Cited

U.S. PATENT DOCUMENTS

| | | | |
|---|---|---|---|
| 3,522,075 | 7/1970 | Kiel | 427/226 |
| 3,619,235 | 11/1971 | Furuuchi et al. | 427/168 |
| 3,984,591 | 10/1976 | Plumat et al. | 427/168 |
| 4,308,316 | 12/1981 | Gordon | 427/166 |
| 4,329,379 | 5/1982 | Terneu et al. | 427/166 |
| 4,419,386 | 12/1983 | Gordon | 427/166 |
| 4,617,206 | 10/1986 | Haisma | 427/226 |

*Primary Examiner*—Janyce A. Bell
*Attorney, Agent, or Firm*—Sughrue, Mion, Zinn, Macpeak & Seas

[57] ABSTRACT

A process for formation of tin oxide film is described, wherein a glass substrate is heated to a high temperature and then tin oxide film is formed on the surface of said substrate by a thermal decomposition oxidation reaction caused by bringing a tin compound or a mixture of a tin compound and a fluorine-containing compound into contact with the surface of said glass substrate, and wherein prior to the formation of tin oxide film, said glass substrate is preliminarily brought into contact with a solution of chloride of a metal belonging to Group IVB of the Periodic Table so that a layer of a composition containing the chloride of the Group IVB metal as the primary component is formed on the surface of said substrate.

7 Claims, 1 Drawing Sheet

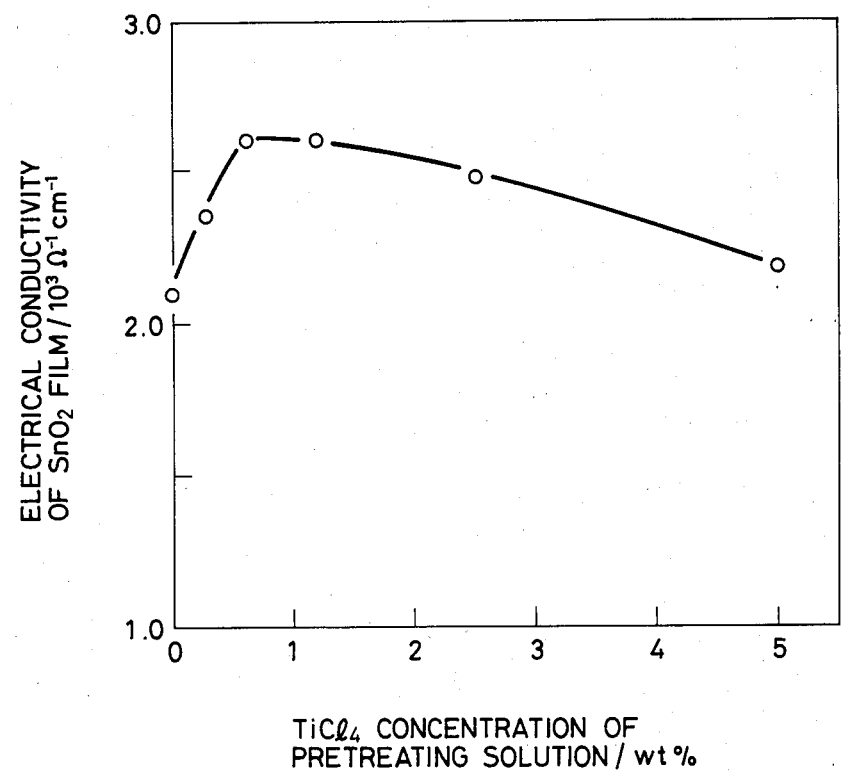

PROCESS FOR FORMATION OF TIN OXIDE FILM

FIELD OF THE INVENTION

This invention relates to a process for formation of tin oxide film, and more particularly to a technique wherein a glass substrate is heated to a high temperature and then a tin compound is brought into contact with the surface of said substrate and said tin compound is subjected to thermal decomposition oxidation reaction so as to form tin oxide film on the surface of said substrate.

BACKGROUND OF THE INVENTION

When, in general, tin oxide film is formed on the surface of a glass substrate, the tin oxide film is found to have an excellent hardness, so that it is in wide use for the prevention of the formation of flaws on the surfaces of glassware such as bottles, tableware, electric bulbs, etc. Also, there are many applications utilizing the fact that the tin oxide film doped with a halogen, especially fluorine, or antimony, exhibits metallic properties. For instance, glasses on whose surface tin oxide film has been formed, are in use as transparent electrode plates of semiconductor devices including liquid crystal cells, solar cells, etc., as well as the surface heating unit of antifogging glass, etc. Further, the tin oxide film is also extremely useful for window glass used for the purpose of improving air heating or as the cover glass of solar heat collector, by virtue of its infrared ray reflection characteristics.

Heretofore, as the process for coating a glass substrate with tin oxide, various processes have been proposed, but as the process most adapted for mass production, processes taking advantage of a thermal decomposition oxidation reaction of tin compounds are known. For instance, from long ago a process has been used wherein a solution containing tin tetrachloride dissolved in a solvent is sprayed on the high temperature surface of a glass substrate (liquid spraying process) or a process wherein a fine powder of organotin compounds such as dibutyltin oxide, etc. suspended in a gas is sprayed on the high temperature surface of a glass substrate (powder spraying process). Recently, the so-called CVD process wherein the vapor obtained by evaporating tin tetrachloride or dimethyltin dichloride is brought into contact with the high temperature surface of a glass substrate is also in wide use. For the tin oxide films formed by these processes, the fields of their application have recently been rapidly increasing, particularly, wherein their high electrical conductivity and high light transmittance are demanded. For this reason, there has been proposed for the purpose of obtaining a tin oxide film having the high electrical conductivity a process wherein use is made of a novel tin compound, and a process characterized in that a suitable amount of an additive is mixed with a tin compound. For instance, a process wherein a tin oxide film excellent in electrical conductivity is obtained by the use of a vapor mixture of tetramethyltin [$(CH_3)_4Sn$] and bromotrifluoromethane [$CF_3Br$] according to a CVD (chemical vapor deposition) process has been described in Japanese Patent Application (OPI) No. 58363/80 (the term "OPI" as used herein means an "unexamined published application"). Also, a process wherein a tin oxide film excellent in the electrical conductivity is obtained by the use of a vapor mixture of monobutyltin trichloride [$C_4H_9SnCl_3$] and a fluorine-containing compound of the structure $CF_2HX$ (X is hydrogen, halogen, or alkyl radical) according to a CVD process has been described in Japanese Patent Application (OPI) No. 162269/84.

In addition to the above, a process is also known wherein quartz glass or borosilicate glass is used in place of soda-lime glass as the substrate for the purpose of obtaining a tin oxide film excellent in the electrical conductivity, or in the case where the substrate is soda-lime glass, a process wherein the surface of the substrate is preliminarily covered with silicon oxide film prior to the formation of the tin oxide film.

However, the electrical conductivity of the tin oxide films obtained according to these processes is such that the electrical conductivity, $\sigma = 3000 \Omega - 1 cm - 1$ (specific resistance $\rho = 1/\sigma = 3.3 \times 10^{-4} \Omega \cdot cm$) is the limit attainable, showing that it is uncomparable to that of the tin oxide-added indium oxide film.

SUMMARY OF THE INVENTION

The present inventors extensively investigated processes wherein the surface of the glass substrate is preliminarily treated prior to the formation of tin oxide film relationship to the formation of tin oxide films utilizing thermal decomposition oxidation reaction (hereinafter referred to as the "pretreatment"), and as the result it has been discovered that when the surface of a glass substrate is subjected to a pretreatment such that a solution of a Group IVB chloride, that is, a solution of titanium tetrachloride ($TiCl_4$), zirconium tetrachloride ($ZrCl_4$), or hafnium tetrachloride ($HfCl_4$), or a mixture thereof (hereinafter referred to as the "treating solution") is brought into contact with the surface of said glass substrate, whereby a layer of a composition containing the Group IVB chloride as the primary component is formed on the surface of said substrate, and then, after said substrate has been heated to a high temperature (450° C.–600° C.) a tin compound is brought into contact with said pretreated surface of the glass substrate so that a tin oxide film is formed thereon by a thermal decomposition oxidation reaction, the resulting tin oxide film is particularly excellent in electrical conductivity.

BRIEF DESCRIPTION OF THE DRAWING

The drawing shows a graph representing the relationship between the concentration of the pretreating solution and the electrical conductivity of the tin oxide film obtained in an example of this invention.

DETAILED DESCRIPTION OF THE INVENTION

In the preferred embodiment of this invention the Group IVB chloride is dissolved in a solvent so that the concentration is from 0.1 to 10.0 wt%, and more preferably from 0.3 to 3.0 wt%, in which case as the solvent use can be made of water, methanol, ethanol, isopropanol, butanol, toluene, methyl ethyl ketone, etc.

The treating solution obtained in this way can be brought into contact with the surface of a glass substrate so as to form a layer of the composition containing a Group IVB chloride as the primary component on the surface of the glass substrate by various methods, but in a preferred embodiment of this invention the glass substrate is immersed in the treating solution, and immediately thereafter is taken out of the solution, in which case the surface of the substrate is in the state of being wetted with the treating solution. Then, by evaporating the solvent of the treating solution adhered on the surface of the substrate a layer of the composition containing Group IVB chloride as the chief ingredient is formed on the surface of said substrate.

In another embodiment of this invention, the treating solution is applied on the desired portion to be treated for the formation of excellently conductive oxide of the surface of said glass substrate. This portion of the surface of the substrate becomes wetted with the treating solution. Then, by evaporating the solvent of the treating solution adhered on the surface of the substrate a layer of the composition containing a Group IVB chloride as the primary component is formed on the surface of the substrate.

In still another embodiment of this invention the treating solution is sprayed through a nozzle mechanism onto the surface of the substrate heated to a temperature of from 30° to 600° C., or preferably from 50° to 200° C., whereby the solvent of the treating solution which was sprayed and reached the surface of the substrate evaporates quickly, so that a layer of the composition containing Group IVB chloride as the primary component is formed on the surface of the substrate.

The thus pretreated glass substrate on whose surface the layer of the composition containing Group IVB chloride as the chief ingredient has been formed is heated to a high temperature. By bringing a tin compound into contact with the surface of said substrate, especially with the surface on which the layer of the composition containing a Group IVB chloride as the primary component has been formed thermal decomposition reaction is utilized to cause the formation of tin oxide.

The tin oxide film formed in this way on the layer of the composition containing the Group IVB chloride as the primary component on the surface of the glass substrate is possessed of a high electrical conductivity as compared with the tin oxide film formed on the surface of the ordinary glass substrate under the same conditions. The reason, though not as yet quite clear, may be accounted for by considering the fact that in the tin oxide film formed on the layer of the composition containing a Group IVB chloride as the primary component, the crystal particles of the tin oxide film which is polycrystalline has a tendency of growing large as compared with the tin oxide film formed on the surface of the ordinary glass substrate under the same conditions, and hence the mobility of the carrier of the electrical conductivity of the tin oxide film is enhanced.

With reference to some examples this invention is further explained below.

EXAMPLE 1

The surface of a soda-lime glass substrate covered with $SiO_2$ film, about 1200 Å thick, was wetted with aqueous solutions of various metal chlorides, and then by evaporating the solvent by hot air drying said surface of the substrate was treated so as to form the layer of the composition containing each of the metal chlorides as the chief ingredient thereon. Next, the substrate was heated to 550° C., and by bringing a gaseous mixture comprising vapor of monobutyltin trichloride, vapor of 1,1-difluoroethane, water vapor, oxygen, and nitrogen into contact with the thus-treated surface of the substrate tin oxide film, a deposited film of about 4500 Å thickness was formed on said surface of the substrate.

Table 1 shows the electrical conductivity and the specific resistance of the tin oxide film formed on the surface of the substrate treated with the aqueous solution of each of the metal chlorides. In Table 1, for comparison, the electrical conductivities of the tin oxide films according to the conventional process, which were formed directly on the same substrate without the pretreatment under the same conditions are also shown together.

From Table 1 it is clear that the tin oxide films formed on the surface of the substrate which was treated using the aqueous solution of a Group IVB metal chloride, that is, titanium chloride, zirconium chloride, or hafnium chloride, that is, titanium chloride, zirconium chloride, or hafnium chloride as the treating solution is superior in the electrical conductivity to those formed without the pretreatment. In accordance with the process of this invention, it is possible to form, for instance, a tin oxide film whose electrical conductivity is from 10 to 20% higher than the conventional films.

EXAMPLE 2

Aqueous solutions of titanium chloride at different concentrations were prepared in advance as the treating solutions, and after a soda-lime glass substrate covered with $SiO_2$ film, about 1000 Å thick, was immersed in each of these treating solutions, the substrate was taken out of the solution and subjected to the treatment of evaporating the solvent by hot air drying. Then, the substrate was heated to 550° C., and after the surface of the substrate was treated according to the process described in Example 1, a tin oxide film of 2500 Å thickness was formed thereon.

The relationship between the concentration of the treating solution and the electrical conductivity of the tin oxide film formed on the surface of the substrate treated by the use of the treating solution each having a different concentration is shown in the drawing.

TABLE 1

| | Electrical Conductivity and Specific Resistance of $SnO_2$ Film* (Effect of Pretreatment of Substrate) | | | |
|---|---|---|---|---|
| Treating Solution | | Characteristics | | |
| Metal Chloride | Concentration/wt % | Electrical Conductivity $(\sigma/10^3 \Omega^{-1} cm^{-1})$ | Specific Resistance $(\rho/10^{-4} \Omega cm)$ | Remarks |
| — | (no treatment) | 2.4 | 4.2 | conventional process |
| $TiCl_4$ | 2.5 | 2.6 | 4.2 | present invention |
| $TiCl_4$ | 1.2 | 2.8 | 3.6 | present invention |
| $ZrCl_4$ | 2.5 | 2.7 | 3.7 | present |

TABLE 1-continued

Electrical Conductivity and
Specific Resistance of SnO₂ Film*
(Effect of Pretreatment of Substrate)

| Treating Solution | | Characteristics | | |
| --- | --- | --- | --- | --- |
| Metal Chloride | Concentration/wt % | Electrical Conductivity ($\sigma/10^3 \Omega^{-1} cm^{-1}$) | Specific Resistance ($\rho/10^{-4} \Omega cm$) | Remarks |
| ZrCl₄ | 1.0 | 2.9 | 3.5 | present invention |
| HfCl₄ | 1.0 | 2.8 | 3.6 | present invention |
| NaCl | 5.0 | 1.5 | 6.5 | comparative example |
| NaCl | 2.5 | 2.0 | 5.0 | comparative example |
| ZnCl₂ | 5.0 | 1.6 | 6.1 | comparative example |
| ZnCl₂ | 2.5 | 2.1 | 4.7 | comparative example |
| SnCl₂ | 0.1 | 2.1 | 4.8 | comparative example |
| PdCl₂ | 0.1 | 2.0 | 5.0 | comparative example |
| AlCl₃·6H₂O | 5.0 | 2.4 | 4.2 | comparative example |
| InCl₃ | 5.0 | 2.2 | 4.5 | comparative example |
| SbCl₃ | 1.0 | 2.4 | 4.2 | comparative example |
| SnCl₄·5H₂O | 5.0 | 1.9 | 5.4 | comparative example |

*Thickness of SnO₂ film: 4000Å

From the drawing it is clear that the tin oxide films formed on the surface of the substrate treated by the use of the treating solutions at the concentrations of from 0.3 to 5% have a high electrical conductivity as compared with the tin oxide films formed on the surface of the same substrate without the pretreatment under the same conditions, and especially in the case where use is made of the treating solutions at the concentration of from 0.6 to 1.2%, tin oxide films are obtained whose electrical conductivity is about 20% higher than that of the conventional films.

EXAMPLE 3

A 0.5% ethanolic solution of zirconium chloride was prepared in advance as the treating solution, and after a soda-lime glass substrate covered with SiO₂ film, about 1000 Å thick, was immersed in the treating solution and then taken out of said solution; the substrate was subjected to the treatment of evaporating the solvent by hot air drying. Then, the substrate was heated to 550° C., and after the surface of the substrate was treated according to the process described in Example 1, tin oxide film of 2500 Å thickness was formed thereon.

The electrical characteristics of tin oxide film thus formed are shown in Table 2, in which the electrical characteristics of the tin oxide film according to the conventional process which was formed on the same substrate without the pretreatment under the same conditions are shown together as a comparative example.

From Table 2 it is found that even by the treating solution using ethanol as the solvent there is obtained a tin oxide film which is excellent in the conductivity and especially high in the carrier mobility in accordance with the process of this invention.

EXAMPLE 4

A 1.0% ethanolic solution of zirconium chloride was prepared in advance as the treating solution, and sprayed onto the surface of a soda-lime glass substrate heated to about 150° C. by means of an air spray gun, in which case the solvent of the treating solution sprayed evaporated quickly owing to the heat of the substrate, and a layer of the composition containing zirconium chloride as the chief ingredient was formed on the surface of the substrate.

Then, the substrate was heated to 600° C., and on the surface of the treated substrate a mixed solution comprising dibutyltin diacetate, trifluoroacetic acid, and ethanol was sprayed by means of a spray gun, so as to be brought into contact with the substrate, whereby a tin oxide film of 2300 Å thickness was formed.

Separately, a tin oxide film was formed directly on a soda-lime glass substrate heated to 600° C. by the same process as described above. The electrical conductivity of each tin oxide film is shown in Table 3. From Table 3 it is obvious that the tin oxide film obtained is excellent in conductivity in accordance with this invention.

EXAMPLE 5

A 1.0% aqueous solution of zirconium chloride was prepared in advance as the treating solution, and after having been applied onto the surface of a borosilicate glass substrate, the solvent of the treating solution was allowed to evaporate by drying. Then the substrate was heated to 550° C., and after the surface of the substrate was treated according to the process described in Example 1, tin oxide film of 4800 Å thickness was formed thereon also in the manner described in Example 1.

Separately, a borosilicate glass substrate without the pretreatment was heated to 550° C., and tin oxide film was formed thereon under the same conditions.

The electrical characteristics of each tin oxide film is shown in Table 4. In Table 4, it is found that in accordance with the conventional process, there is obtained tin oxide film whose conductivity $\sigma = 3.0 \times 10^3 \Omega^{-1} \text{cm}^{-1}$, whereas in accordance with the process of this invention, there is obtained tin oxide whose conductivity is more excellent, attaining $3.6 \times 10^3 \Omega^{-1} \text{cm}^{-1}$. In this case, the carrier mobility is also high as compared with the conventional films.

TABLE 2

Electrical Characteristics of $SnO_2$ Film*

| | Pretreating Solution for Substrate | Electrical Conductivity $\sigma/10^3 \Omega^{-1}\text{cm}^{-1}$ | Mobility $\mu/\text{cm}^2 V^{-1} S^{-1}$ | Carrier Density $n/10^{20}\text{cm}^{-3}$ |
|---|---|---|---|---|
| Process of the present invention | $ZrCl_4$ 0.5 wt % Ethanolic solution | 2.6 | 24.6 | 6.6 |
| Conventional process | No treatment | 2.1 | 19.2 | 6.8 |

*Thickness of $SnO_2$ film: 2500Å

TABLE 3

Electrical Conductivity and Specific Resistance of $SnO_2$ Film*

| | Pretreating Solution for Substrate | Electrical Conductivity $\sigma/10^3 \Omega^{-1}\text{cm}^{-1}$ | Specific Resistance $\rho/10^{-4} \Omega \text{cm}$ |
|---|---|---|---|
| Process of the present invention | $ZrCl_4$ 1.0 wt % Ethanolic | 1.4 | 7.4 |
| Conventional process | No treatment | 1.2 | 8.5 |

*Thickness of $SnO_2$ film: 2300Å

TABLE 4

Electrical Characteristics of $SnO_2$ Film*

| | Pretreating Solution for Substrate | Electrical Conductivity $\sigma/10^3 \Omega^{-1}\text{cm}^{-1}$ | Mobility $\mu/\text{cm}^2 V^{-1} S^{-1}$ | Carrier Density $n/10^{20}\text{cm}^{-3}$ |
|---|---|---|---|---|
| Process of the present invention | $ZrCl_4$ 0.5 wt % Ethanolic solution | 3.6 | 32.7 | 6.9 |
| Conventional process | No treatment | 3.0 | 27.2 | 6.9 |

*Thickness of $SnO_2$ film: 4800Å

While the invention has been described in detail and with reference to specific embodiments thereof, it will be apparent to one skilled in the art that various changes and modifications can be made therein without departing from the spirit and scope thereof.

What is claimed is:

1. A process for formation of a tin oxide film, wherein a glass substrate is heated to a high temperature of from 450° C. to 600° C. and then a tin oxide film is formed on the surface of said substrate by a thermal decomposition oxidation reaction caused by bringing a tin compound or a mixture of a tin compound and a fluorine-containing compound into contact with the surface of said glass substrate, and wherein prior to the formation of said tin oxide film, said glass substrate is preliminarily brought into contact with a solution of chloride of a metal belonging to Group IVB of the Periodic Table so that a layer of a composition containing the chloride of the Group IVB metal as the primary component is formed on the surface of said substrate wherein the chloride of the group IVB is contained in said solution in an amount of from 0.1 to 10.0 wt. %.

2. A process as in claim 1, wherein said chloride of a metal belonging to Group IVB of the Periodic Table is titanium chloride $TiCl_4$.

3. A process as in claim 1, wherein said chloride of a metal belonging to Group IVB of the Periodic Table is zirconium chloride.

4. A process as in claim 1, wherein said chloride of a metal belonging to Group IVB of the Periodic Table is hafnium chloride.

5. A process as in claim 1, wherein the chloride of the group IVB is contained in said solution in an amount of from 0.3 to 3.0 wt%.

6. A process as in claim 1, wherein said solution of chloride of a group IVB metal is brought into contact with said glass substrate by spraying through a nozzle mechanism onto the surface of the substrate at a temperature of from 50° to 200° C.

7. A process as in claim 5, wherein said solution of chloride of a group IVB metal is brought into contact with said glass substrate by spraying through a nozzle mechanism onto the surface of the substrate at a temperature of from 50° to 200° C.

* * * * *